United States Patent
Quevedo-Lopez et al.

(10) Patent No.: US 7,115,530 B2
(45) Date of Patent: Oct. 3, 2006

(54) TOP SURFACE ROUGHNESS REDUCTION OF HIGH-K DIELECTRIC MATERIALS USING PLASMA BASED PROCESSES

(75) Inventors: Manuel A. Quevedo-Lopez, Plano, TX (US); James J. Chambers, Dallas, TX (US); Luigi Colombo, Dallas, TX (US); Mark R. Visokay, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/726,987

(22) Filed: Dec. 3, 2003

(65) Prior Publication Data
US 2005/0124109 A1     Jun. 9, 2005

(51) Int. Cl.
*H01L 21/31*     (2006.01)
(52) U.S. Cl. .............. 438/778; 438/772; 438/777; 438/785; 438/786

(58) Field of Classification Search ............... 438/772, 438/777, 778, 785, 786
See application file for complete search history.

(56) References Cited

U.S. PATENT DOCUMENTS

| | | | |
|---|---|---|---|
| 6,391,802 B1* | 5/2002 | Delpech et al. | 438/785 |
| 2004/0127003 A1* | 7/2004 | Chambers | 438/591 |

FOREIGN PATENT DOCUMENTS

WO   WO 2004021409 A2 *  3/2004

\* cited by examiner

*Primary Examiner*—Mary Wilczewski
*Assistant Examiner*—Toniae M. Thomas
(74) *Attorney, Agent, or Firm*—Jacqueline J. Garner; W. James Brady, III; Frederick J. Telecky, Jr.

(57) ABSTRACT

A system and method for manufacturing semiconductor devices with dielectric layers having a dielectric constant greater than silicon dioxide includes depositing a dielectric layer on a substrate and subjecting the dielectric layer to a plasma to reduce top surface roughness in the dielectric layer.

24 Claims, 1 Drawing Sheet

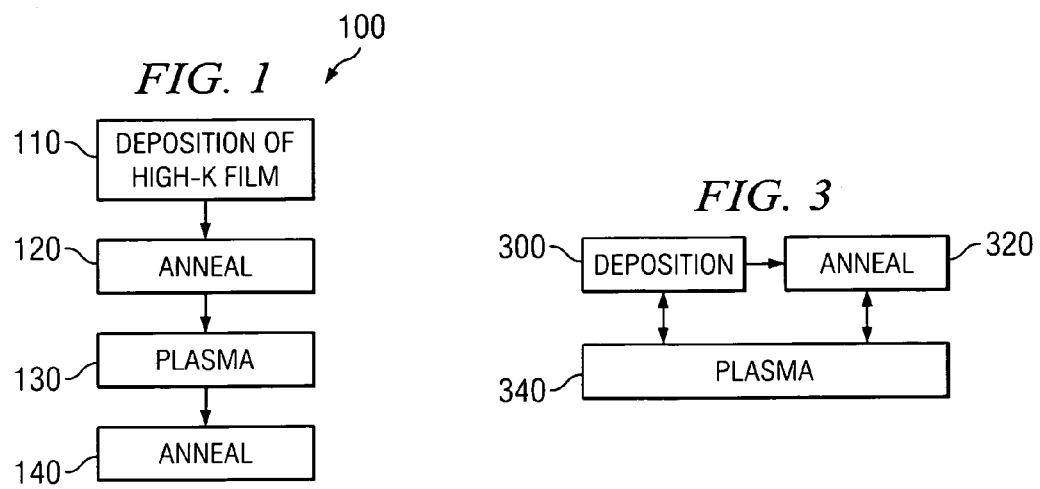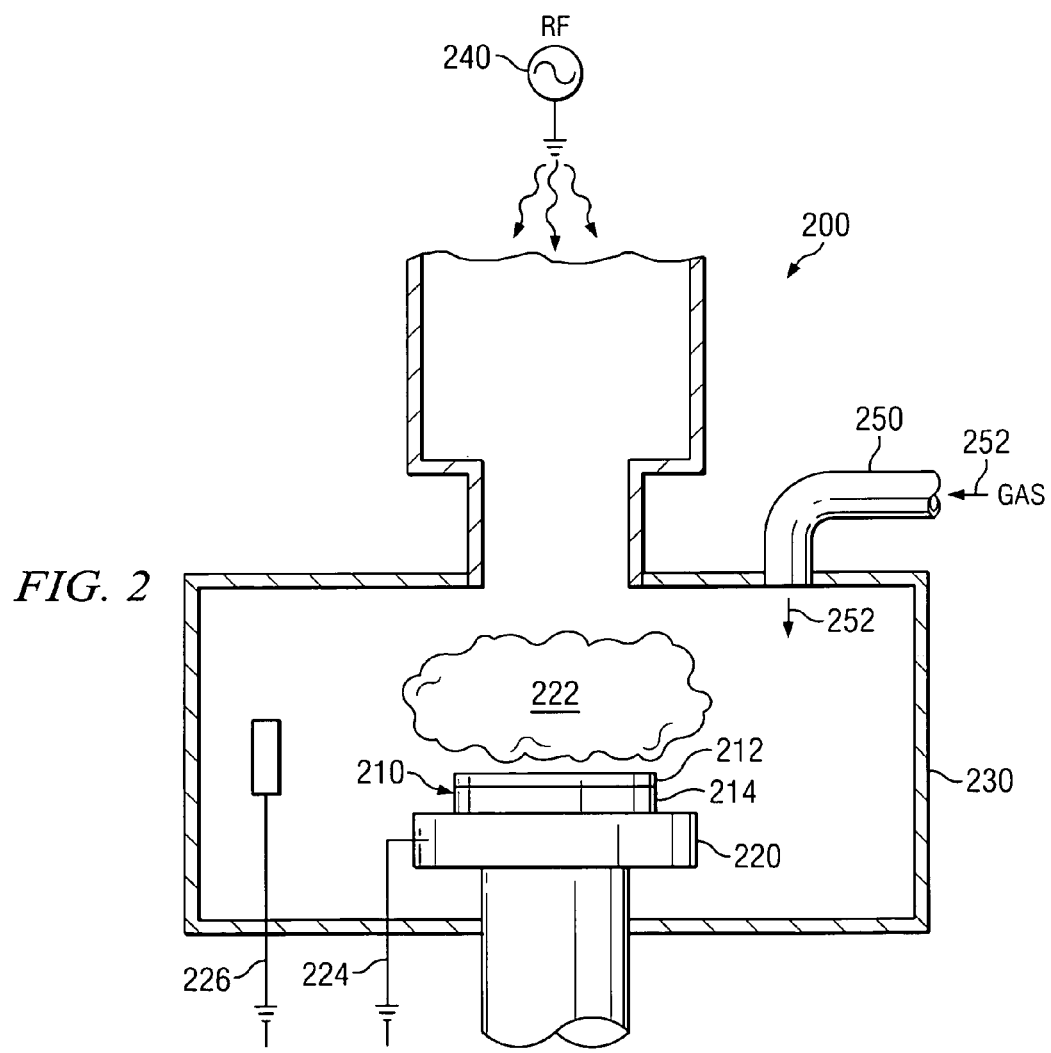

TOP SURFACE ROUGHNESS REDUCTION OF HIGH-K DIELECTRIC MATERIALS USING PLASMA BASED PROCESSES

TECHNICAL FIELD OF THE INVENTION

This invention relates generally to manufacturing semiconductor devices with high-dielectric constant materials, and more specifically to a system and method for reducing top surface roughness of the high dielectric constant material.

BACKGROUND OF THE INVENTION

Continuing trends in semiconductor product manufacturing include reduction in electrical device feature sizes (scaling), as well as improvements in device performance in terms of device switching speed and reduced power consumption. Metal-oxide-semiconductor (MOS) transistor performance may be improved by reducing the distance between the source and the drain regions under the gate electrode of the device, known as the gate or channel length, and by reducing the thickness of the layer of gate oxide that is formed over the semiconductor surface. Field effect transistors (FETs) are widely used in the electronics industry for amplification, filtering, and other tasks related to both analog and digital electrical signals.

One of the most common FETs is a metal-oxide-semiconductor field effect transistor (MOSFET). MOSFETs generally have a metal or polysilicon gate contact or electrode that is biased to create an electric field in the channel region of a semiconductor body. The semiconductor body can be silicon, strained silicon on SiGe, Ge, or strained silicon by other means. This electric field inverts the channel and enables a current flow between the source region and the drain region of the semiconductor body. The source and drain regions are typically formed by adding dopants to targeted regions on either side of the channel region in a semiconductor substrate. The gate dielectric or gate oxide, such as silicon dioxide ($SiO_2$), is normally grown over the channel region, typically by thermal oxidation of the Si substrate. A gate electrode or gate contact is then formed over the gate dielectric, and the gate dielectric and gate electrode materials are then patterned to form a gate structure overlying the channel region of the substrate.

Recent efforts directed to MOS device scaling have accordingly focused on dielectric materials having dielectric constants greater than that of $SiO_2$. These materials, commonly known as high-k dielectric materials, reduce gate current leakage compared to that of equivalent $SiO_2$ or nitrided $SiO_2$ as a result of a higher physical gate dielectric thickness while keeping the overall capacitance density to the required equivalent $SiO_2$ thickness.

Unlike silicon dioxide, high-k gate dielectrics are deposited on the silicon surface rather than grown. Deposition processes usually do not yield surfaces as smooth as those of the grown silicon oxide and the surface roughness of the films can promote device degradation. The relative performance of these high-k materials is often expressed as equivalent oxide thickness (EOT). Equivalent oxide thickness, ($t_{eq}$ or EOT) is the thickness of the $SiO_2$ layer ($\kappa \sim 3.9$) having the same capacitance as a given thickness of an alternate dielectric layer.

EOT represents the theoretical thickness of $SiO_2$ that would be required to achieve the same capacitance density as the alternate dielectric and is given by:

$$t_{eq} = 3.9\varepsilon_0\left(\frac{A}{C}\right)$$

For example, if a $SiO_2$ capacitor is used, and assuming that 1.0 nm of this film produces a capacitance density of (C/A)=34.5 fF/$\mu m^2$, the physical thickness of an alternate dielectric that must be used in order to achieve the same capacitance density is given by:

$$\frac{t_{eq}}{\kappa_{ox}} = \frac{t_{high-\kappa}}{\kappa_{high-\kappa}}$$

This can be rearranged as:

$$t_{high-\kappa} = \frac{\kappa_{high-\kappa}}{3.9}t_{eq}$$

where 3.9 is $\kappa_{SiO2}$. Therefore, an alternate gate dielectric with a relative permittivity of 16 and physical thickness of 4.0 nm can be used to obtain $t_{eq}$~1.0 nm.

Various problems are associated with depositing high-k dielectrics onto substrates; some of these problems are: interfacial $SiO_2$ formation, limited availability of precursors, and very low depositions rates. Furthermore, most of these high-k materials are likely to be crystallized during further thermal processing, creating more defects such as grain boundaries and surface roughness at the dielectric/gate electrode interface. Depositing high-k dielectrics onto substrates also results in a rough surface morphology. Additionally, as the thickness of the gate dielectric material deposited decreases, improvement in surface roughness is required.

Common techniques or methods to deposit high-k dielectrics include chemical vapor deposition (CVD), atomic layer deposition (ALD), or physical vapor deposition (PVD) processes. The performance and reliability of the resulting transistors with these deposited high-k materials depends upon the bulk quality of the high-k dielectric material, as well as the quality of the interfaces between the high-k gate dielectric material, the gate (which can be poly-silicon or a metal gate), and the channel material. Therefore, there is a need for improved gate structures and fabrication techniques by which high quality gate dielectrics and interfaces can be achieved using high-k dielectric materials.

SUMMARY OF THE INVENTION

In accordance with embodiments of the present invention, problems associated with surface roughness of deposited high-k dielectric materials in semiconductor devices are substantially reduced or eliminated. In one embodiment, a method is provided that includes depositing a high-k dielectric film on a substrate. The dielectric layer preferably has a dielectric constant higher than the dielectric constant of silicon dioxide (~3.9). Additionally, the method includes subjecting the dielectric layer to a plasma that operates to reduce surface roughness in the dielectric layer. Additional embodiments of this invention may include annealing the dielectric layer prior to subjecting the layer to plasma, after subjecting the layer to the plasma, or both.

In another embodiment of the present invention, a system is provided that includes a deposition chamber in which a dielectric layer having a high dielectric constant is deposited on a substrate. Additionally, this embodiment includes a plasma chamber in which the dielectric layer is exposed to a plasma in order to reduce the top surface roughness in the dielectric layer. Additional embodiments may include depositing and smoothing the dielectric layer in the same chamber (i.e., an in-situ process), and may also include an annealing chamber, in which surface or bulk imperfections in the high-k film (such as oxygen vacancies, dangling bonds, etc.) resulting from the plasma treatment may be substantially reduced or eliminated.

An advantage of the present invention includes minimization of surface roughness in deposited high-k films by exposing the deposited high-k film to energetic ions (plasma). Yet another advantage, from the annealing process after plasma treatment, includes reducing imperfections in the resulting high-k films and an increased ability to scale to low equivalent oxide thickness (EOT). Embodiments of the present invention may include some, none, or all of the enumerated advantages. Additional advantages will be apparent to those of ordinary skill in the art.

BRIEF DESCRIPTION OF THE DRAWINGS

For a more complete understanding of the present invention and the advantages thereof, reference is now made to the following description taken in conjunction with the accompanying drawings:

FIG. 1 is a flow chart illustrating a method according to the present invention;

FIG. 2 is an example of a system for reducing top surface roughness of high-k dielectric materials in accordance with an embodiment of the present invention; and FIG. 3 is a block diagram of a system in accordance with an embodiment of the present invention.

DETAILED DESCRIPTION OF THE DRAWINGS

Current manufacturing methods of semiconductor devices generally include creating a layer of a dielectric material, or a "gate dielectric" on a substrate. The substrate is typically silicon or other appropriate semiconductor material such as strained silicon, silicon germanium or germanium, though other materials may be used. Generally, the gate dielectric film, or layer, is created by oxidizing the existing silicon substrate, or by depositing a silicon oxide layer on the substrate. The dielectric layer is used to isolate the gate from the Si substrate. Currently, gate dielectrics deposited or grown on semiconductors are used in a wide variety of MOS devices, any of which may be used as capacitors, transistors, or any other type of integrated circuit.

In accordance with embodiments of the present invention, examples of high-k dielectrics for use in dielectric films include, but are not limited to: binary metal oxides including aluminum oxide ($Al_2O_3$), zirconium oxide ($ZrO_2$), hafnium oxide ($HfO_2$), lanthanum oxide ($La_2O_3$), yttrium oxide ($Y_2O_3$), titanium oxide ($TiO_2$), as well as their silicates and aluminates; metal oxynitrides. Some of these materials are aluminum oxynitride (AlON), zirconium oxynitride (ZrON), hafnium oxynitride (HfON), lanthanum oxynitride (LaON), yttrium oxynitride (YON), as well as their silicates and aluminates such as ZrSiON, HfSiON, LaSiON, YSiON, TaSiON, and NbSiON or others; and perovskite-type oxides including a titanate system material such as barium titanate, strontium titanate, barium strontium titanate (BST), lead titanate, lead zirconate titanate, lead lanthanum zirconate titanate, barium lanthanum titanate, barium zirconium titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and bi-layered perovskite system material such as strontium bismuth tantalate, bismuth titanate and others, that may either provide the opportunity for smaller gates and gate arrays to be manufactured on semiconductor devices.

The higher dielectric constant of the high-k gate dielectric films allows reduced leakage for an equivalent oxide thickness. However, current methods of depositing high-k gate dielectrics on substrates can provide rough and uneven surfaces. As gate dielectrics become smaller, down to only few angstroms, for example, a change in dielectric thickness will produce a substantial change in stack capacitance and therefore in device performance. Accordingly, depositing gates and gate arrays (poly-Si or metal gates) on high-k dielectric layers may result in non-uniform capacitance, and therefore reduce the efficiency, increase the leakage current non-uniformities, and may cause overall degradation of the integrated circuit.

FIG. 1 illustrates a method 100 for reducing surface roughness for high-k gate dielectrics deposited on substrate. At step 110, a high-k dielectric film is deposited on a substrate. The deposition of the high-k film may be accomplished by chemical vapor deposition (CVD), atomic layer deposition (ALD), physical vapor deposition (PVD), plasma enhanced chemical vapor deposition (PECVD), or any other acceptable dielectric layer deposition technique, such as spin-on, or others. Current deposition techniques for high-k gate dielectrics can produce films with thickness variations that are greater than the thinnest areas of the film. As gates and gate arrays are reduced in size, even slight variations in film thickness may cause problems associated with leakage current.

At step 120, the gate dielectric layer may be annealed. The annealing at step 120 may serve multiple purposes. For example, step 120 may be an oxygen anneal to eliminate oxygen vacancies, or a nitrogen anneal to increase the density of the high-k film. The anneal may also reduce any resulting contamination in the high-k film present in the dielectric layer from the deposition by evaporation or reaction with the annealing environment. For example, when the dielectric layers are deposited using either atomic layer or chemical vapor deposition processes using metalorganic precursors, many impurities, such as carbon, or hydroxyl groups may be present in the dielectric layer due to the relatively low temperature deposition of the dielectric film. Accordingly, a high temperature anneal may reduce these impurities that are present by subjecting them to higher temperatures and removing them from the dielectric layer. The same may happen during annealing of dielectric films deposited by ALD using chloride precursors. Alternatively, the annealing at step 120 may be omitted.

At step 130, the dielectric layer is subjected to a plasma. This plasma is preferably operable to reduce the surface roughness of the dielectric layer. According to the present embodiment, numerous types of plasma treatments may be used at step 130. For example, input plasmas, such as He, Ne, He, Kr or Xe, may be used to smooth the high-k dielectric. A plasma containing nitrogen may be desirable whereby the excited nitrogen ions may even the distribution of the dielectric layer on the substrate by bombarding the dielectric layer, while simultaneously introducing nitrogen into the dielectric layer. As an example, a dielectric film may be deposited as a binary metal oxide, such as $HfO_2$, and after being subjected to the nitrogen plasma, constitute a metal oxynitride such as HfON. As mentioned above, many other metals with high dielectric constants may be used in the dielectric film. Accordingly, the dielectric film after plasma treatment may include nitrogen embedded in a ternary oxide such as HfSiO deposited on a substrate to form HfSiON, or nitrogen embedded in a metal oxide deposited on a substrate, as well as many other high-k materials mentioned above.

The plasma used at step 130 is used to reduce top-surface roughness and may be a single-frequency plasma or a multiple-frequency plasma. Multiple-frequency plasmas are often beneficial for use due to their ability to cause multiple effects simultaneously. For example, a dual-frequency plasma may be used at step 130 to simultaneously smooth or etch the dielectric layer and implant nitrogen or other desired species into the dielectric layer.

Once the plasma treatment at step 130 is completed, the dielectric layer may be annealed a second time at step 140 whereby impurities and defects resulting from the plasma treatment, in the dielectric layer may be removed. Alternatively, a light oxidation anneal may be performed at step 140 whereby the bonds that may have been broken due to subjecting the dielectric layer to a high energy plasma can be reformed by introducing ionized oxygen into the dielectric layer. In an alternative embodiment, step 140 may be omitted.

In various embodiments of the method illustrated by FIG. 1, the steps 110 through 140 may be performed repetitively, thus allowing multiple layers to be deposited, annealed, smoothed by plasma, and annealed.

FIG. 2 illustrates a system 200 for reducing surface roughness of a dielectric layer. System 200 preferably includes a semiconductor wafer 210 having a dielectric layer 212 deposited on a substrate 214. Semiconductor wafer 210 is preferably placed on a chuck 220 located within a plasma chamber 230. A plasma 222 is introduced into the chamber by ionizing a gas input to the chamber through gas inlet 250. In the present embodiment, nitrogen or nitrous oxide may be used as the gas 252 introduced through gas inlet 250. Additionally or alternatively, any suitable inert gas, such as He, Ne, Ar, Xe, or other inert gas, a reactive gas, such as $H_2$ gas or other reactive gas, or a combination thereof, may be used to generate plasma 222. Upon introducing gas 252 into chamber 230, an rf source 240 introduces radio waves into chamber 230. The radio waves introduced into chamber 230 preferably ionize gas 252 into a plasma 222 operable to interact with dielectric layer 212 of semiconductor wafer 210. The radio waves may be introduced at multiple frequencies or may be at a single frequency. Additionally, leads 224 and 226 may be alternatively charged to increase the excited state of the plasma 222 induced by the radio waves introduced through the rf source 240. Alternatively, leads 224 and 226 may operate to provide a heat source into the plasma chamber to facilitate a high temperature anneal when no plasma is present in the chamber, or to provide additional heat and energy for the chamber when doing a plasma anneal.

FIG. 3 illustrates a system for reducing top surface roughness of the dielectric layer that includes a deposition system 300, an annealing system 320, and a smoothing system 340. Deposition system 300 is preferably operable to deposit a dielectric film on a substrate. The deposition system may accomplish this deposition by atomic layer deposition, chemical vapor deposition, plasma enhanced chemical vapor deposition, physical vapor deposition, or any other deposition method such as spin-on or others. Once the dielectric film has been deposited on the substrate, an annealing system 320 may anneal the dielectric layer. The annealing system 320 may be a high temperature rapid thermal annealing system, a plasma based anneal, a high temperature plasma based anneal, a low temperature oxidation anneal, or any other anneal depending on the desired properties of the dielectric layer. For example, anneal system 320 may be a low temperature oxidation anneal designed to increase the oxidation of the dielectric layer by forming additional oxidation bonds. Alternatively, anneal system 320 may be a plasma anneal designed to incorporate nitrogen into the dielectric layer. An alternative of the plasma anneal may be an inert plasma anneal designed to remove impurities at higher temperatures such as carbon, chlorine, or other impurities commonly present as a result of deposition of the dielectric film. It should be noted that anneal system 320 may not be required depending on the use of the semiconductor wafer, the type of dielectric layer deposited on substrate, or other factors.

Plasma system 340 preferably exposes the dielectric layer to a plasma in order to reduce the top surface roughness of the dielectric film. Accordingly, plasma system 340 may implement different types of plasmas to achieve the desired surface smoothness or the desired surface properties of the dielectric layer. Accordingly, plasmas introduced by plasma system 340 may be inert plasmas such as argon, helium, or other inert gases, or may be reactive plasmas such as oxygen, ammonia, ozone, nitrogen, or nitrous oxide. A combination of reactive an inert gases in the plasma can also be used ($N_2$:He, $N_2$:$H_2$, etc). Additionally, plasma system 340 may be operable to generate multi-frequency plasma to simultaneously provide multiple effects in the dielectric layer.

By example only, and not by way of limitation, a hafnium silicon oxynitride dielectric layer may be deposited on the substrate. In such a case, hafnium silicon oxide may be deposited by deposition system 300 using CVD, ALD, PECVD, PVD, or any other accepted deposition technique, such as spin-on, or others. After the deposition of the hafnium silicon oxide, the semiconductor device may or may not be subjected to annealing system 320. After deposition, plasma system 340 may subject the dielectric layer to a nitrogen-based plasma such as $N_2$. Additionally, annealing systems 320 and plasma system 340 may be introduced simultaneously to implant nitrogen and improve the stoichiometry of the dielectric layer. In such a case, nitrogen or nitrous oxide may be used in the annealing system 320 and plasma system 340. Alternatively, annealing system 320 may be used after plasma system 340.

A wide range of temperatures, power settings, and pressures may be utilized by plasma system 340. For example, plasma system 340 may operate at 100 to 2000 W, at temperatures from 50° C. to 1200° C., and at pressures from 1 milliTorr to 100 milliTorr. Additionally, in various embodiments of the present invention as illustrated by FIG. 3, deposition system 300, annealing system 320, and plasma system 340 may include interchangeable elements and perform functions simultaneously. For example, a plasma anneal may be a simultaneous use of annealing system 320 and plasma system 340 by subjecting the dielectric layer to a high-temperature plasma. Alternatively, or additionally, deposition system 300 may utilize a plasma, such as PECVD, such that plasma system 340 and deposition system 300 work together as a part of a simultaneous application of the two systems, or result in the dual use of a single system with characteristics of both systems 300 and 340. Further, annealing system 320 and deposition system 300 may be a single application of both systems simultaneously. A combination of deposition system 300 and annealing system 320 may be preferable for the high temperature deposition of a high-k dielectric layer using a CVD or other deposition process. Yet another embodiment of the systems illustrated by FIG. 3 may provide for a simultaneous use of all three systems 300, 320, and 340.

Although the present invention has been described in detail, it should be understood that various changes, substitutions, and alterations may be made, without departing from the spirit and scope of the present invention as defined by the claims.

What is claimed is:

1. A method for manufacturing a semiconductor device, comprising:
   depositing a dielectric layer on a substrate, the dielectric layer having a dielectric constant greater than the dielectric constant of silicon dioxide;
   subjecting the dielectric layer to a plasma, the plasma operable to reduce top surface roughness in the dielectric layer; and
   annealing the dielectric layer before subjecting the dielectric layer to the plasma.

2. A method for manufacturing a semiconductor device, comprising:
   depositing a dielectric layer on a substrate, the dielectric layer having a dielectric constant greater than the dielectric constant of silicon dioxide;
   subjecting the dielectric layer to a plasma, the plasma operable to reduce top surface roughness in the dielectric layer; and
   annealing the dielectric layer after subjecting the dielectric layer to the plasma.

3. The method of claim 1, where the resulting high-k comprises hafnium silicon oxy-nitride.

4. The method of claim 1, wherein the dielectric layer comprises hafnium silicon oxide.

5. The method of claim 1, wherein the dielectric layer comprises hafnium oxide.

6. A method for manufacturing a semiconductor device, comprising:
   depositing a dielectric layer on a substrate, the dielectric layer having a dielectric constant greater than the dielectric constant of silicon dioxide;
   subjecting the dielectric layer to a plasma, the plasma operable to reduce top surface roughness in the dielectric layer, wherein the dielectric layer comprises a hafnium aluminum oxide.

7. The method of claim 1, wherein the dielectric layer comprises an oxide from the group of lanthanum oxide, gadolinium oxide, tantalum oxide, yittrium oxide, titanium oxide, chromium oxide, aluminum oxide, and zirconium oxide.

8. A method for manufacturing a semiconductor device, comprising:
   depositing a dielectric layer on a substrate, the dielectric layer having a dielectric constant greater than the dielectric constant of silicon dioxide;
   subjecting the dielectric layer to a plasma, the plasma operable to reduce top surface roughness in the dielectric layer, wherein the dielectric layer comprises a ternary transition metal oxide from the group of ZrHfO, TaTiO, ZrTiO, HfNbO, HfVO, ZrVO, TaNbO, TaVO, TaNbO, HfTiO, and HfTaO.

9. The method of claim 1, wherein the dielectric layer comprises a ternary oxide.

10. The method of claim 1, wherein the dielectric layer has a dielectric constant greater than 3.9.

11. The method of claim 1, wherein depositing a dielectric layer on a substrate comprises chemical vapor deposition.

12. The method of claim 1, wherein depositing a dielectric layer on a substrate comprises atomic layer deposition.

13. The method of claim 1, wherein depositing a dielectric layer on a substrate comprises physical vapor deposition.

14. The method of claim 1, wherein the plasma is an argon plasma.

15. The method of claim 1, wherein the plasma is a xenon plasma.

16. The method of claim 1, wherein the plasma is a krypton plasma.

17. The method of claim 1, wherein the plasma is an oxygen plasma.

18. A method for manufacturing a semiconductor device, comprising:
   depositing a dielectric layer on a substrate, the dielectric layer having a dielectric constant greater than the dielectric constant of silicon dioxide;
   subjecting the dielectric layer to a plasma, the plasma operable to reduce top surface roughness in the dielectric layer, wherein the plasma is a nitrogen plasma, the nitrogen plasma further operable to incorporate nitrogen into the dielectric layer.

19. The method of claim 1, wherein the plasma is a helium plasma.

20. The method of claim 1, wherein the plasma is a combination of any plasmas from the group of plasmas including argon, xenon, krypton, oxygen, nitrogen, and helium.

21. The method of claim 1, wherein annealing the dielectric layer further comprises using an inert plasma.

22. The method of claim 1, wherein annealing the dielectric layer further comprises heating the dielectric layer to remove impurities.

23. The method of claim 2, wherein annealing the dielectric layer further comprises subjecting the dielectric layer to a nitrogen plasma, the nitrogen plasma operable to incorporate nitrogen into the dielectric layer.

24. The method of claim 1, wherein the plasma comprises a dual-frequency plasma.

* * * * *